(12) United States Patent
Tanaka

(10) Patent No.: US 9,971,152 B2
(45) Date of Patent: May 15, 2018

(54) PROJECTOR AND HEAD-UP DISPLAY DEVICE

(71) Applicant: Funai Electric Co., Ltd., Daito, Osaka (JP)

(72) Inventor: Fuminori Tanaka, Daito (JP)

(73) Assignee: FUNAI ELECTRIC CO., LTD., Osaka (JP)

( * ) Notice: Subject to any disclaimer, the term of this patent is extended or adjusted under 35 U.S.C. 154(b) by 0 days. days.

(21) Appl. No.: 15/344,792

(22) Filed: Nov. 7, 2016

(65) Prior Publication Data

US 2017/0131549 A1 May 11, 2017

(30) Foreign Application Priority Data

Nov. 10, 2015 (JP) ................. 2015-220002

(51) Int. Cl.
*G02B 26/12* (2006.01)
*G02B 27/01* (2006.01)
*G02B 26/10* (2006.01)
*H04N 9/31* (2006.01)
*B81B 3/00* (2006.01)

(52) U.S. Cl.
CPC ............ *G02B 27/0101* (2013.01); *B81B 3/00* (2013.01); *G02B 26/101* (2013.01); *G02B 27/0149* (2013.01); *H04N 9/3129* (2013.01); *G02B 2027/0154* (2013.01)

(58) Field of Classification Search
CPC ............... G02B 26/105; G02B 26/101; G02B 26/0858; G02B 26/0841; G02B 26/085

USPC ............ 359/199.1–199.3, 200.1, 200.2
See application file for complete search history.

(56) References Cited

U.S. PATENT DOCUMENTS

| 6,057,952 | A | 5/2000 | Kubo et al. | |
|---|---|---|---|---|
| 6,661,393 | B2 * | 12/2003 | Tegreene | G02B 26/0841 345/4 |
| 2007/0216982 | A1 | 9/2007 | Sanders et al. | |
| 2012/0257235 | A1 * | 10/2012 | Hino | G02B 26/085 358/1.13 |
| 2014/0185117 | A1 * | 7/2014 | Hino | G02B 26/101 359/199.3 |

FOREIGN PATENT DOCUMENTS

| JP | 2008-514977 A | 5/2008 |
|---|---|---|
| JP | 2011-090030 A | 5/2011 |
| JP | 2012-185194 A | 9/2012 |
| KR | 10-2015-0042958 A | 4/2015 |
| WO | 2011/142210 A1 | 11/2011 |
| WO | 2013/110665 A1 | 8/2013 |

* cited by examiner

*Primary Examiner* — Mohammed Hasan

(74) *Attorney, Agent, or Firm* — Keating & Bennett, LLP

(57) ABSTRACT

A projector includes a light source portion that emits laser light, a first reflection portion that is swingable and reflects the laser light from the light source portion, and a second reflection portion that is swingable and reflects the laser light from the first reflection portion. The laser light from the light source portion passes through an opening provided near the second reflection portion and is irradiated to the first reflection portion.

18 Claims, 7 Drawing Sheets

MODIFICATION OF FIRST TO THIRD EMBODIMENTS

PROJECTOR AND HEAD-UP DISPLAY DEVICE

CROSS-REFERENCE TO RELATED APPLICATION

The priority application number JP2015-220002, Projector and Head-Up Display Device, Nov. 10, 2015, Fuminori Tanaka, upon which this patent application is based, is hereby incorporated by reference.

BACKGROUND OF THE INVENTION

Field of the Invention

The present invention relates to a projector and a head-up display device, and more particularly, it relates to a projector and a head-up display device each including an oscillating mirror element.

Description of the Background Art

A projector including an oscillating mirror element is known in general, as disclosed in Japanese Patent Laying-Open No. 2011-090030, for example.

The aforementioned Japanese Patent Laying-Open No. 2011-090030 discloses a projector including a light source portion, a first scanner that reflects projection light from the light source portion, and a second scanner that reflects the projection light reflected by the first scanner. The first scanner and the second scanner are provided on the same plane of the same base. In the projector according to the aforementioned Japanese Patent Laying-Open No. 2011-090030, the projection light reflected by the first scanner is irradiated to the second scanner through a mirror provided on another base that faces the base on which the first scanner and the second scanner are provided. The mirror, the first scanner, and the second scanner are arranged parallel to each other.

However, in the aforementioned Japanese Patent Laying-Open No. 2011-090030, the first scanner and the second scanner are arranged on the same plane, and hence when the projection light substantially orthogonal to the plane on which the first scanner is provided is irradiated to the first scanner, the projection light reflected by the first scanner is irradiated again to the first scanner through the mirror. Thus, in order for the first scanner and the second scanner to reflect the projection light, it is necessary to irradiate the projection light to the first scanner in an oblique direction with respect to the first scanner, and in this case, the spot diameter of the projection light to be irradiated to the first scanner is disadvantageously elliptically shaped such that the quality of a projection image is reduced. In other words, the first scanner and the second scanner are arranged at different sides with respect to the mirror, and hence an angle defined by the optical axis of the projection light from the first scanner to the mirror and the optical axis of the projection light from the mirror to the second scanner is increased to some extent. Thus, the spot diameter of the projection light to be irradiated to the first scanner is disadvantageously elliptically shaped such that the quality of the projection image is reduced.

SUMMARY OF THE INVENTION

The present invention has been proposed in order to solve the aforementioned problem, and an object of the present invention is to provide a projector and a head-up display device each capable of improving the quality of a projection image.

A projector according to a first aspect of the present invention includes a light source portion that emits laser light, a first reflection portion that is swingable and reflects the laser light from the light source portion, and a second reflection portion that is swingable and reflects the laser light from the first reflection portion, and the laser light from the light source portion passes through an opening provided near the second reflection portion and is irradiated to the first reflection portion.

As hereinabove described, the projector according to the first aspect of the present invention includes the first reflection portion that is swingable and reflects the laser light from the light source portion and the second reflection portion that is swingable and reflects the laser light from the first reflection portion, and the laser light from the light source portion passes through the opening provided near the second reflection portion and is irradiated to the first reflection portion. Thus, as compared with the case where the laser light is irradiated from a position away beyond the opening from the second reflection portion to a reflection surface, the laser light can pass close to the second reflection portion, and hence the optical axis of the laser light toward the first reflection portion and the optical axis of the laser light from the first reflection portion toward the second reflection portion can be brought close to each other. More specifically, the spot diameter in the first reflection portion can be shaped to approximate a true circle. Consequently, the quality of a projection image can be improved.

The aforementioned projector according to the first aspect of the present invention preferably further includes a base that is provided with the opening and supports the second reflection portion such that the second reflection portion is swingable. According to this structure, the optical axis of the laser light that passes through the opening of the base to the first reflection portion and the optical axis of the laser light from the first reflection portion toward the second reflection portion can be brought close to each other as compared with the case where the laser light is irradiated from the outside of the base to the reflection surface not through the opening. More specifically, the spot diameter in the first reflection portion can be shaped to approximate a true circle. Consequently, the quality of the projection image can be further improved.

In the aforementioned projector according to the first aspect, the first reflection portion preferably scans the laser light in one of a horizontal direction and a vertical direction of a projection image by swinging. According to this structure, the quality of the projection image can be improved while the first reflection portion scans the laser light in one of the horizontal direction and the vertical direction of the projection image.

In this case, the second reflection portion preferably scans the laser light in the other of the horizontal direction and the vertical direction of the projection image by swinging. According to this structure, the quality of the projection image can be improved while the first reflection portion and the second reflection portion scan the laser light in the horizontal direction and the vertical direction of the projection image.

In the aforementioned projector according to the first aspect, the first reflection portion and the second reflection portion are preferably arranged such that reflection surfaces for the laser light thereof face each other. According to this structure, the first reflection portion and the second reflection portion that reflects the laser light from the first reflection portion face each other, whereby the spot diameter in the first reflection portion can be shaped to approximate a true circle.

In the aforementioned projector according to the first aspect, the laser light from the light source portion preferably passes through the opening from a back surface side opposite to a refection surface for the laser light of the second reflection portion to be irradiated to the first reflection portion. According to this structure, the laser light passes through the opening from the back surface side of the second reflection portion, and hence the reflection surface of the first reflection portion and the reflection surface of the second reflection portion can easily face each other.

In the aforementioned projector according to the first aspect, the laser light reflected by the first reflection portion is preferably directly irradiated to the second reflection portion. According to this structure, unlike the case where the laser light is indirectly irradiated to the second reflection portion through another reflection structure other than the first reflection portion, another reflection structure is not required, and hence the structure of the projector can be simplified.

In the aforementioned structure including the base, the projector preferably further includes a substrate on which the base is mounted, and the substrate is preferably provided with a through-hole through which the laser light from the light source portion passes and is guided to the opening. According to this structure, various wires for swinging of the second reflection portion can be provided on the substrate, and the laser light can be guided to the opening of the base through the through-hole of the substrate while the base is held by the substrate.

In the aforementioned structure including the substrate, the through-hole of the substrate preferably overlaps with the opening of the base and has an opening area larger than an opening area of the opening. According to this structure, the laser light can be easily guided to the opening of the base through the through-hole of the substrate.

In the aforementioned structure including the base, the base preferably includes a pair of beam portions that supports the second reflection portion such that the second reflection portion is swingable, and is preferably provided with the opening being adjacent to at least one of the second reflection portion and the pair of beam portions. According to this structure, in order to allow the second reflection portion and the pair of beam portions to swing, the base is provided with a hollow space in the vicinity of the second reflection portion and the pair of beam portions, and hence the existing hollow space in the vicinity of the second reflection portion and the pair of beam portions can be used as the opening. Consequently, no opening for passage of the laser light may be separately provided in the base, and hence the structure of the projector can be simplified.

In this case, the opening preferably has an elongated shape that extends in a direction in which the pair of beam portions extends. According to this structure, even when the laser light is inclined in the direction in which the pair of beam portions extends, the laser light can pass through the opening without interfering with the base.

In the aforementioned structure in which the base includes the pair of beam portions, the opening preferably includes a first opening provided at a first side with respect to the pair of beam portions and the second reflection portion, through which the laser light passes, and a second opening provided at a second side with respect to the pair of beam portions and the second reflection portion, and the pair of beam portions and the second reflection portion are preferably sandwiched between the first opening and the second opening. According to this structure, the first opening and the second opening between which the pair of beam portions and the second reflection portion are sandwiched are provided, whereby the pair of beam portions and the second reflection portion can be easily swung. Furthermore, the laser light can pass close to the pair of beam portions and the second reflection portion through the first opening.

In this case, the first reflection portion is preferably arranged closer to the first opening with respect to the second reflection portion. According to this structure, even when the laser light from the light source portion is parallel to the swing axis of the second reflection portion, the laser light can be irradiated to the first reflection portion, and the laser light can be reflected to the second reflection portion. Consequently, the degree of freedom of the layout of the first reflection portion and the second reflection portion can be improved.

In the aforementioned structure in which the base includes the pair of beam portions, the first reflection portion is preferably arranged closer to one of the pair of beam portions at a third side with respect to the second reflection portion, and the laser light to be irradiated to the first reflection portion preferably passes through a portion of the opening in the vicinity of the other of the pair of beam portions at a fourth side with respect to the second reflection portion. According to this structure, the laser light is inclined with respect to the second reflection portion to pass through the opening, whereby the spot diameter in the first reflection portion can be shaped to approximate a true circle, and the first reflection portion and the second reflection portion can be brought close to each other to be arranged in a V-shape.

In the aforementioned structure including the base, the base is preferably provided with the opening on a line that is an extension of a swing axis of the second reflection portion. According to this structure, the optical axis of the laser light can be arranged on the swing axis of the second reflection portion in a plan view, and hence the spot diameter of the laser light to be irradiated to the first reflection portion and the second reflection portion can be shaped to further approximate a true circle as compared with the case where the optical axis of the laser light is deviated from the swing axis in a plan view. Consequently, the quality of the projection image can be further improved.

In this case, the base preferably includes a pair of beam portions that supports the second reflection portion such that the second reflection portion is swingable, and a beam support portion that supports the pair of beam portions, and the pair of beam portions preferably includes a connection portion having a first end connected to the second reflection portion, and a pair of branch portions branched from a second end of the connection portion and connected to the beam support portion, between which the opening is sandwiched. According to this structure, the opening can be easily formed on the line that is the extension of the swing axis of the second reflection portion by the connection portion and the pair of branch portions.

In the aforementioned projector according to the first aspect, the second reflection portion preferably has a rectangular shape having a short side that intersects with a swing axis of the second reflection portion in a plan view, and a longitudinal direction of the second reflection portion is preferably inclined with respect to the swing axis of the second reflection portion. According to this structure, when the laser light is scanned while the optical axis thereof is inclined with respect to the swing axis of the second reflection portion, the longitudinal direction of the second reflection portion can be along the optical axis of the laser light reflected by the first reflection portion, and hence the second reflection portion can be reduced in size as compared with the case where the longitudinal direction of the second reflection portion is the same as a direction in which the swing axis extends.

The aforementioned projector according to the first aspect preferably further includes a light guide portion that bends an optical axis of the laser light from the light source portion in a direction toward the first reflection portion, and the opening is preferably arranged on a path of the laser light from the light guide portion toward the first reflection portion. According to this structure, the laser light can be reliably guided to the opening by the light guide portion.

In the aforementioned structure including the base, the base is preferably provided with a drive portion that swings the second reflection portion. According to this structure, the second reflection portion can be easily swung by the drive portion provided on the base.

A head-up display device according to a second aspect of the present invention includes a light source portion that emits laser light to project an image corresponding to a virtual image that a user visually recognizes, a first reflection portion that is swingable and reflects the laser light from the light source portion, and a second reflection portion that is swingable and reflects the laser light from the first reflection portion, and the laser light from the light source portion passes through an opening provided near the second reflection portion and is irradiated to the first reflection portion.

As hereinabove described, the head-up display device according to the second aspect of the present invention includes the first reflection portion that is swingable and reflects the laser light from the light source portion and the second reflection portion that is swingable and reflects the laser light from the first reflection portion, and the laser light from the light source portion passes through the opening provided near the second reflection portion and is irradiated to the first reflection portion. Thus, as compared with the case where the laser light is irradiated from a position away beyond the opening from the second reflection portion to a reflection surface, the optical axis of the laser light toward the first reflection portion and the optical axis of the laser light from the first reflection portion toward the second reflection portion can be brought close to each other. More specifically, the spot diameter in the first reflection portion can be shaped to approximate a true circle. Consequently, the quality of a projection image can be improved.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to the drawings.

[First Embodiment]

(Structure of Projector)

The structure of a projector 100 according to a first embodiment of the present invention is now described with reference to FIGS. 1 to 5.

Figure 1:
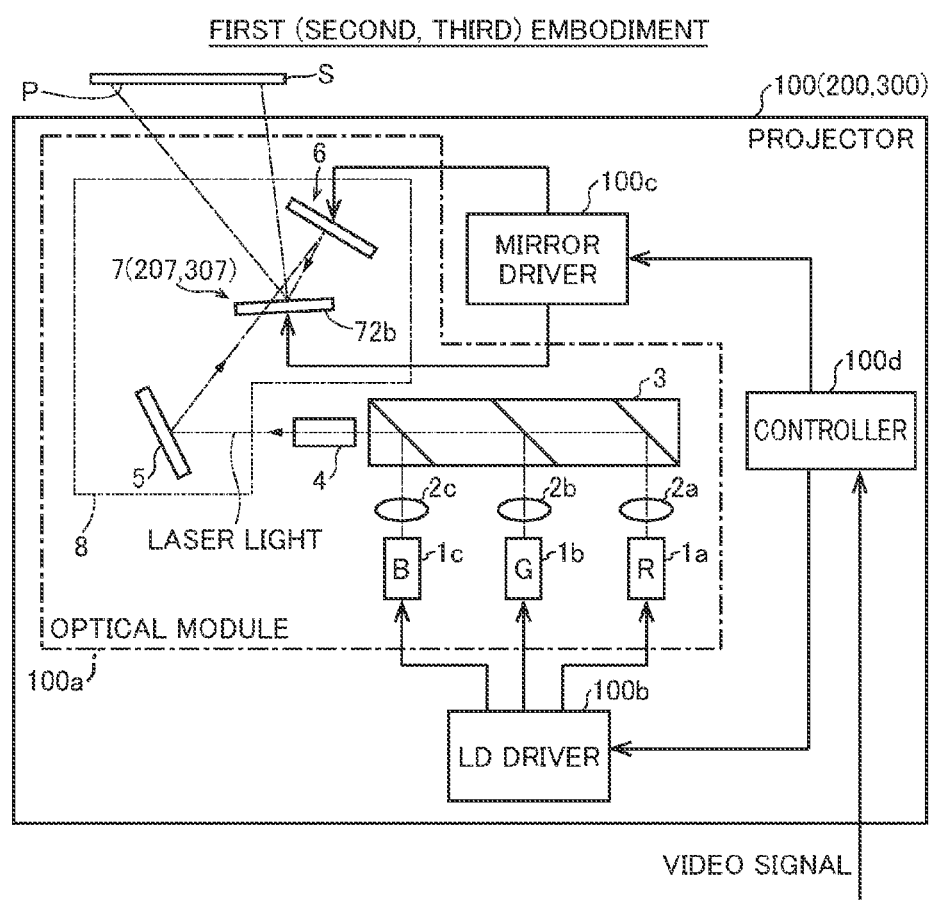
FIG. 1 is a block diagram showing the overall structure of a projector according to first to third embodiments of the present invention.

The projector 100 according to the first embodiment of the present invention includes an optical module 100a, a laser diode driver 100b, a mirror driver 100c, and a controller 100d, as shown in FIG. 1. The projector 100 is configured to project a projection image P on a screen S by irradiating laser light (projection light) from the optical module 100a to the screen S.

<Structure of Optical Module>

The optical module 100a includes three laser diodes 1a to 1c that emit laser light, three collimator lenses 2a to 2c, an RGB synthesis prism 3, a condensing lens 4, a mirror 5, a vertical scanning oscillating mirror element 6, and a horizontal scanning oscillating mirror element 7. In the projector 100, the laser light from the laser diodes 1a to 1c passes through an opening 72a provided near a horizontal scanning mirror portion 71 and is irradiated to a vertical scanning mirror portion 61. The optical module 100a includes a single support member 8 on which the mirror 5, the vertical scanning oscillating mirror element 6, and the horizontal scanning oscillating mirror element 7 are placed. All the mirror 5, the vertical scanning oscillating mirror element 6, and the horizontal scanning oscillating mirror element 7 are placed on the single support member 8 so that the relative positions thereof are determined. The laser light of respective colors emitted from the laser diodes 1a to 1c passes through the collimator lenses 2a to 2c, respectively, and thereafter reaches the RGB synthesis prism 3, the condensing lens 4, and the mirror 5 sequentially. Then, the laser light reflected by the mirror 5 passes through the opening 72a (see FIG. 2), described later, of the horizontal scanning oscillating mirror element 7, and thereafter is reflected by the vertical scanning oscillating mirror element 6. The laser light reflected by the vertical scanning oscillating mirror element 6 is reflected by the horizontal scanning oscillating mirror element 7, and forms the projection image P on the screen S. The laser diodes 1a to 1c are examples of the "light source portion" in the claims. The mirror 5 is an example of the "light guide portion" in the claims.

The laser diodes 1a to 1c are configured to be capable of emitting red (R), green (G), and blue (B) laser light, respectively. The collimator lenses 2a to 2c are configured to convert the laser light of the respective colors emitted from the laser diodes 1a to 1c into parallel light, respectively.

The RGB synthesis prism 3 is configured to synthesize the laser light of the respective colors (three) into a single laser beam by aligning the optical axis of the laser light of the respective colors (three) converted into the parallel light by the collimator lenses 2a to 2c. The mirror 5 is configured to reflect the laser light condensed by the condensing lens 4 toward the vertical scanning oscillating mirror element 6. In other words, the mirror 5 is configured to bend the optical axis of the laser light from the laser diodes 1a to 1c in a direction toward the vertical scanning mirror portion 61.

Figure 2:
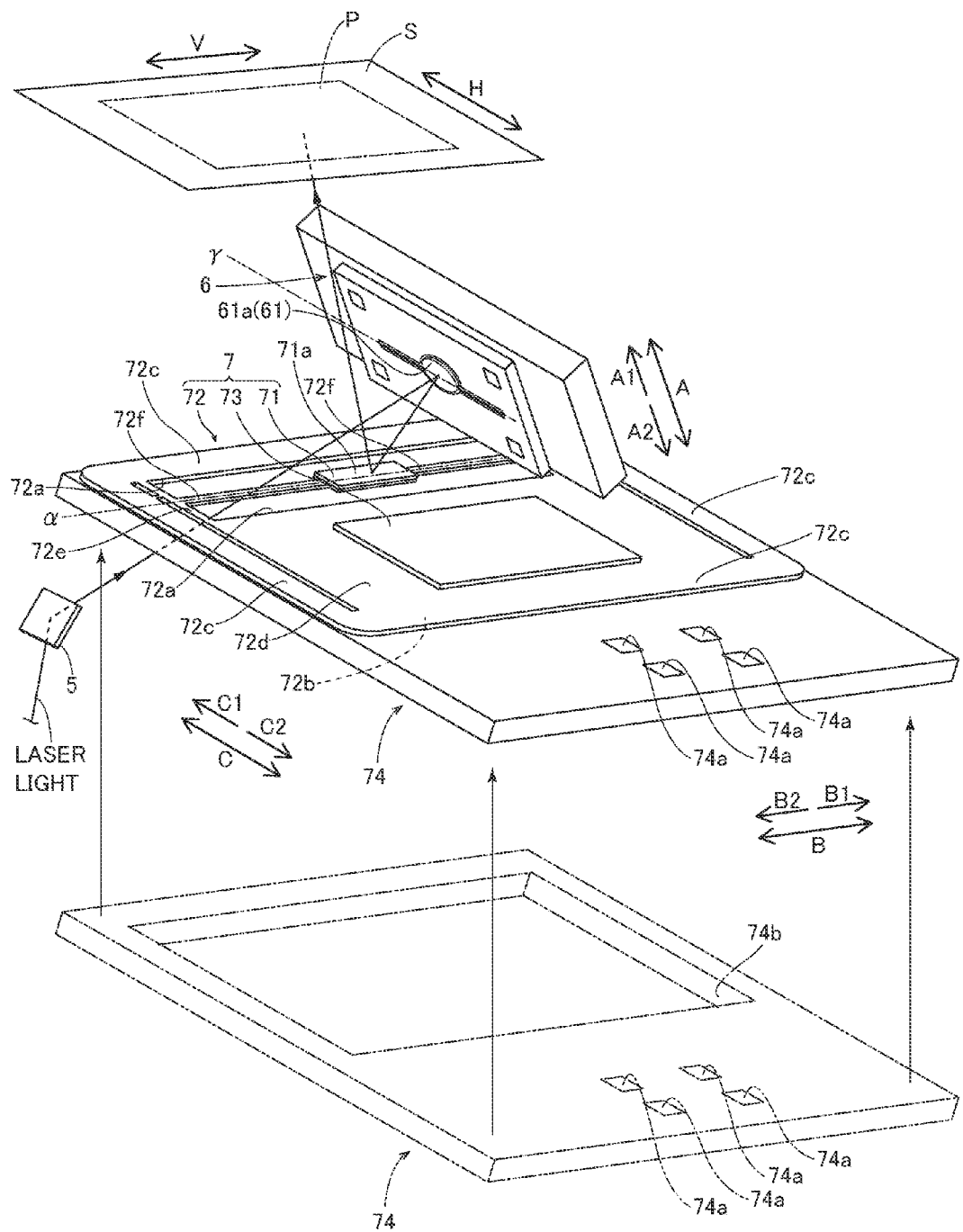
FIG. 2 is a perspective view showing a horizontal scanning oscillating mirror element and a vertical scanning oscillating mirror element of the projector according to the first embodiment of the present invention.

As shown in FIG. 2, the vertical scanning oscillating mirror element 6 is in the form of a rectangular flat plate. In the following description, the short-side direction of the vertical scanning oscillating mirror element 6 is set to a direction A (a direction A1 and a direction A2). The vertical scanning oscillating mirror element 6 includes the vertical scanning mirror portion 61 circularly formed. The vertical scanning oscillating mirror element 6 is configured to reflect the laser light from the mirror 5 (laser diodes 1a to 1c). The vertical scanning mirror portion 61 is swingable. Specifically, the vertical scanning mirror portion 61 is provided with a reflection surface 61a that reflects the laser light. The vertical scanning mirror portion 61 is configured to scan the laser light in the vertical direction (the direction V, the upward-downward direction) of the projection image P by swinging. The vertical scanning mirror portion 61 is an example of the "first reflection portion" in the claims.

The horizontal scanning oscillating mirror element 7 is configured to reflect the laser light reflected (vertically scanned) by the vertical scanning oscillating mirror element 6. The horizontal scanning oscillating mirror element 7 includes a base 72 provided with the horizontal scanning mirror portion 71 rectangularly formed. This horizontal scanning mirror portion 71 is swingable. Specifically, the horizontal scanning mirror portion 71 is provided with a reflection surface 71a that reflects the laser light. The horizontal scanning mirror portion 71 is configured to scan the laser light in the horizontal direction (the direction H, the transverse direction) of the projection image P by swinging.

Figure 3:
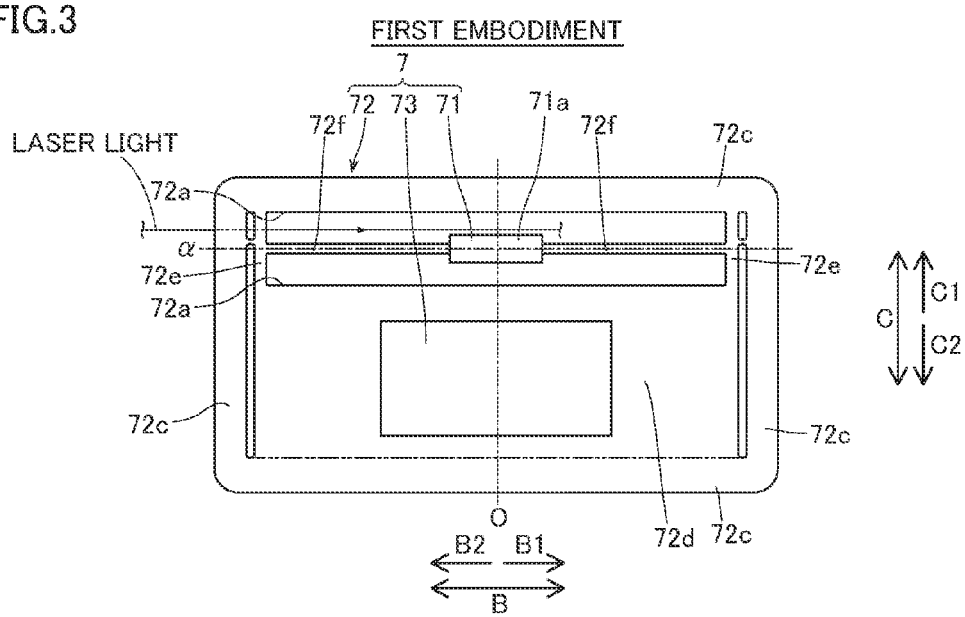
FIG. 3 is a plan view showing the horizontal scanning oscillating mirror element of the projector according to the first embodiment of the present invention.

As shown in FIG. 3, the longitudinal direction of the horizontal scanning mirror portion 71 is the same as a direction in which the swing axis α of the horizontal scanning mirror portion 71 extends. As shown in FIG. 2, the horizontal scanning oscillating mirror element 7 and the vertical scanning oscillating mirror element 6 are arranged such that the reflection surfaces 71a and 61a for the laser light face each other. The horizontal scanning mirror portion 71 is an example of the "second reflection portion" in the claims. The structure of the horizontal scanning oscillating mirror element 7 is described later in detail.

According to the first embodiment, the base 72 is provided with the opening 72a near the horizontal scanning oscillating mirror element 7. The base 72 supports the horizontal scanning mirror portion 71 such that the horizontal scanning mirror portion 71 is swingable. In the projector 100, the laser light (the laser light reflected by the mirror 5) from the laser diodes 1a to 1c (see FIG. 1) passes through the opening 72a to be irradiated to the vertical scanning oscillating mirror element 6. In other words, in the projector 100, the laser light passes through the opening 72a provided in the base 72 and reaches the vertical scanning oscillating mirror element 6.

Specifically, in the projector 100, the laser light from the laser diodes 1a to 1c passes through the opening 72a from a back surface 72b side opposite to the refection surface 71a of the horizontal scanning oscillating mirror element 7 (horizontal scanning mirror portion 71) to be irradiated to the vertical scanning oscillating mirror element 6. In the projector 100, the laser light reflected by the vertical scanning oscillating mirror element 6 is directly irradiated to the horizontal scanning oscillating mirror element 7. As shown in FIG. 1, in the projector 100, the horizontal scanning oscillating mirror element 7 is arranged between the mirror 5 and the vertical scanning oscillating mirror element 6.

The laser diode driver 100b is configured to drive the three laser diodes 1a to 1c under control of the controller 100d. The mirror driver 100c is configured to drive the vertical scanning oscillating mirror element 6 and the horizontal scanning oscillating mirror element 7 under control of the controller 100d. The controller 100d is configured to perform various types of control for projecting the projection image P on the basis of a video signal externally received.

<Structure of Horizontal Scanning Oscillating Mirror Element>

The structure of the horizontal scanning oscillating mirror element 7 is now described in detail with reference to FIGS. 2 to 5.

As shown in FIG. 3, the horizontal scanning oscillating mirror element 7 includes the horizontal scanning mirror portion 71, a drive portion 73, and the base 72 having one surface on which the horizontal scanning mirror portion 71 and the drive portion 73 are provided.

The horizontal scanning mirror portion 71 is made of a material such as silicon. The horizontal scanning mirror portion 71 is in the form of a rectangular flat plate. The horizontal scanning mirror portion 71 is bonded to a pair of beam portions 72f, described later, of the base 72 by an epoxide-based adhesive, for example.

The drive portion 73 is in the form of a rectangular flat plate. The drive portion 73 is bonded to a drive plate portion 72d, described later, of the base 72 by an electrically conductive adhesive. The drive portion 73 includes a piezoelectric body (not shown) and two electrodes (not shown) between which the piezoelectric body is sandwiched. The drive portion 73 is configured to be capable of vibrating (swinging) the horizontal scanning mirror portion 71. Specifically, the two electrodes are wired (not shown), and the drive portion 73 is configured to be driven (expanded and contracted) by a voltage applied between the two electrodes. Thus, the drive portion 73 is configured to vibrate the base 72 (excluding a frame portion 72c described later) and swing the horizontal scanning mirror portion 71 through the base 72.

The base 72 is made of metal (stainless steel or spring steel, for example). The base 72 is in the form of a rectangular flat plate. In the following description, the longitudinal direction of the base 72 is set to a direction B (a direction B1 and a direction B2), and the short-side direction of the base 72 is set to a direction C (a direction C1 and a direction C2).

The laser light is irradiated from one surface (reflection surface 71a) side to the base 72 (horizontal scanning mirror portion 71). The base 72 is symmetric in the direction B. The horizontal scanning mirror portion 71 and the drive portion 73 are mounted on (bonded to) the side of the base 72 closer to one surface (reflection surface 71a). On the centerline O of the base 72 in the direction B, the horizontal scanning mirror portion 71 and the drive portion 73 are arranged in order from the C1 direction side.

The base 72 integrally includes the frame portion 72c, the drive plate portion 72d, a pair of beam support portions 72e, and the pair of beam portions 72f.

The frame portion 72c has a rectangular annular shape (i.e. frame shape) in a plan view. Inside the frame portion 72, the drive plate portion 72d, the pair of beam support portions 72e, and the pair of beam portions 72f are arranged. The frame portion 72c is mounted on a mounting substrate 74, as shown in FIG. 2. The mounting substrate 74 is provided with electrode pads 74a connected with wires (not shown) for receiving a drive signal that drives the drive portion 73. The mounting substrate 74 is formed with a rectangular through-hole 74b at a position corresponding to an inner region of the frame portion 72c in a plan view. The through-hole 74b is configured such that the laser light from the laser diodes 1a to 1c passes therethrough and is guided to the opening 72a. The through-hole 74b of the substrate overlaps with the opening 72a of the base 72 and has an opening area larger than the opening area of the opening 72a. The mounting substrate 74 is an example of the "substrate" in the claims.

As described above, the drive portion 73 is bonded to the drive plate portion 72d. The drive plate portion 72d is in the form of a rectangular flat plate. An end of the drive plate portion 72d in the direction C2 is connected to the frame portion 72c. In FIG. 3, a boundary portion between the drive plate portion 72d and the frame portion 72c is shown by a two-dot chain line. At the C1 direction side, ends of the drive plate portion 72d in the direction B1 and the direction B2 are connected to the beam support portions 72e, respectively.

The pair of beam support portions 72e is in the form of a bar that extends in the direction C. A first end (an end in the direction C2) of the pair of beam support portions 72e is connected to the drive plate portion 72d, and a second end (an end in the direction C1) of the pair of beam support portions 72e is connected to the frame portion 72c. Specifically, the end in the direction C1 of the pair of beam support portions 72e acts as a fixed end. Vibrations from the drive portion 73 are transmitted to the beam support portions 72e through the drive plate portion 72d. The pair of beam support portions 72e supports both ends of the pair of the beam portions 72f, respectively.

The pair of beam portions 72f is in the form of a bar that extends in the direction B orthogonal to the beam support portions 72e. The horizontal scanning mirror portion 71 is bonded to a center between the pair of the beam portions 72f in the direction B. The pair of beam portions 72f is configured to support the horizontal scanning mirror portion 71 such that the horizontal scanning mirror portion 71 is swingable. Specifically, the pair of beam portions 72f is a both-end supported beam having both ends supported by the pair of beam support portions 72e, respectively. Vibrations from the drive portion 73 are transmitted to the pair of beam portions 72f through the beam support portions 72e. The pair of beam portions 72f (horizontal scanning mirror portion 71) is configured to be vibrated (swung) about the swing axis α.

The opening 72a is provided adjacent to the horizontal scanning mirror portion 71 and the pair of beam portions 72f. Specifically, the opening 72a includes an opening 72a provided at a first side (C1 direction side) with respect to the pair of beam portions 72f and the horizontal scanning mirror portion 71 and an opening 72a provided at a second side (C2 direction side) with respect to the pair of beam portions 72f and the horizontal scanning mirror portion 71. A pair of openings 72a has a substantially rectangular shape (elongated shape) that extends in the direction B in a plan view. The opening 72a at the C1 direction side is adjacent to (surrounded by) the horizontal scanning mirror portion 71, the pair of beam portions 72f, the pair of beam support portions 72e, and the frame portion 72c. The opening 72a at the C2 direction side is adjacent to (surrounded by) the horizontal scanning mirror portion 71, the pair of beam portions 72f, the pair of beam support portions 72e, and the drive plate portion 72d. The opening 72a is arranged on a path of the laser light from the mirror 5 toward the vertical scanning mirror portion 61.

The opening 72a at the C1 direction side is an opening 72a through which the laser light passes. The pair of beam portions 72f and the horizontal scanning mirror portion 71 are sandwiched between the pair of openings 72a.

The vertical scanning mirror portion 61 is arranged closer to the opening 72a at the C1 direction side with respect to the horizontal scanning mirror portion 71. The vertical scanning mirror portion 61 is arranged closer to one of the pair of beam portions 72f at the B1 direction side (third side) with respect to the horizontal scanning mirror portion 71. The laser light to be irradiated to the vertical scanning mirror portion 61 passes through a portion of the opening 72a in the vicinity of the other of the pair of beam portions 72f at the B2 direction side (fourth side) with respect to the horizontal scanning mirror portion 71.

(As to Path of Laser Light)

Figure 4:
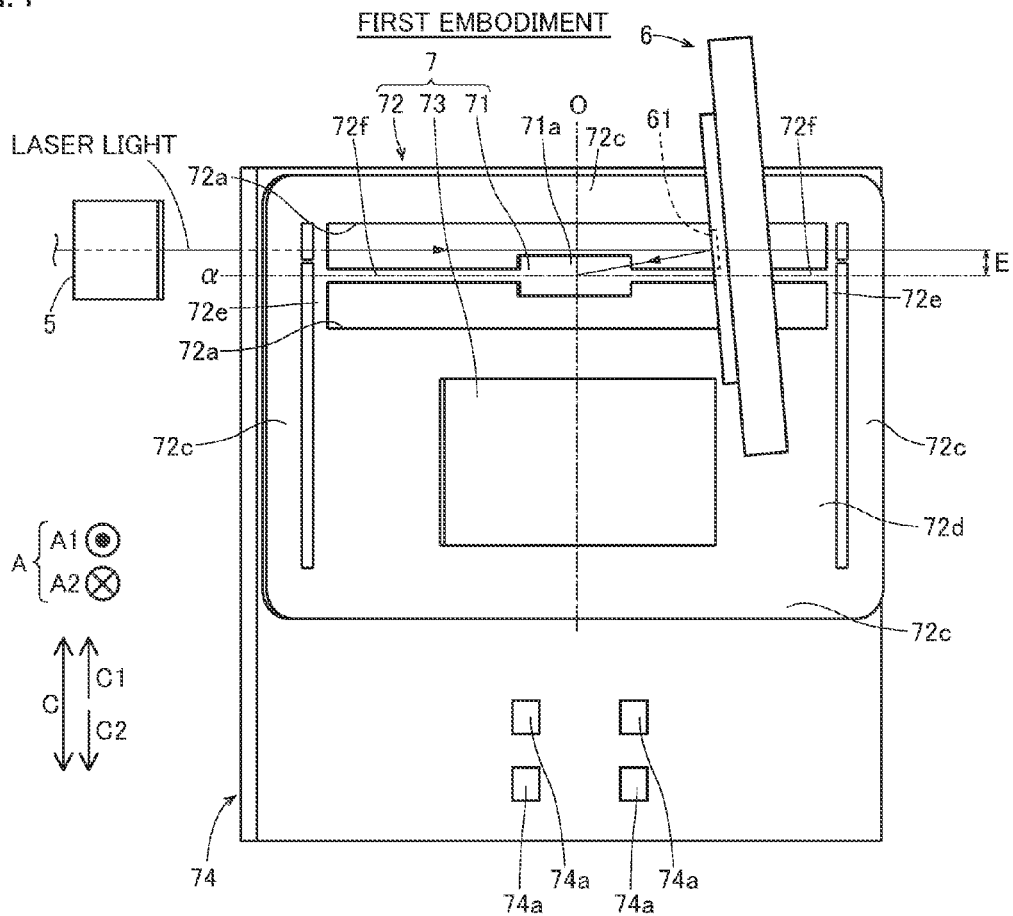
FIG. 4 illustrates a projection light path of the horizontal scanning oscillating mirror element and the vertical scanning oscillating mirror element of the projector according to the first embodiment of the present invention.
Figure 5:
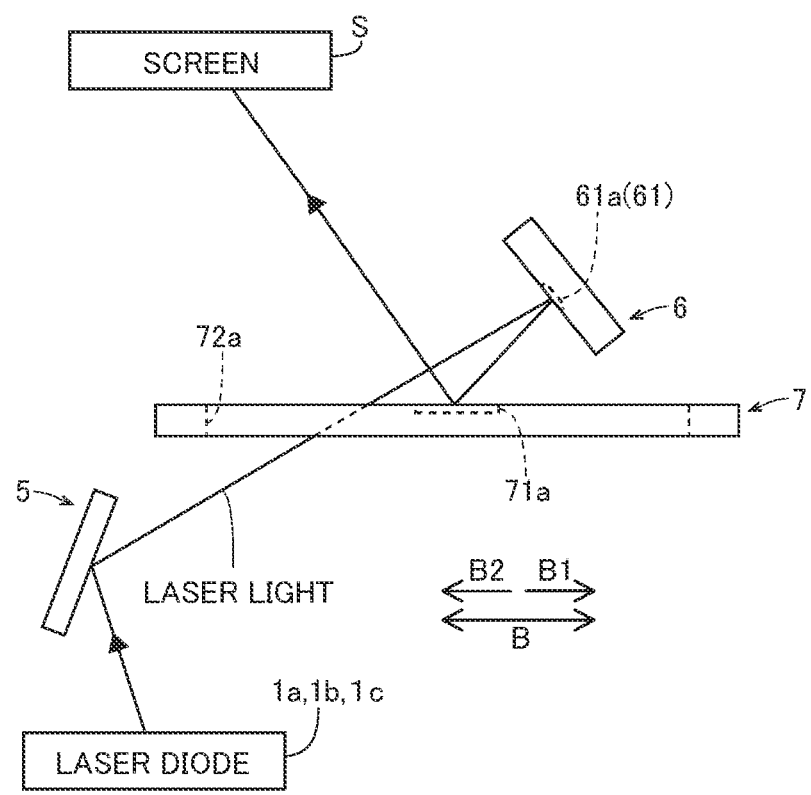
FIG. 5 is a schematic side elevational view showing the horizontal scanning oscillating mirror element and the vertical scanning oscillating mirror element of the projector according to the first embodiment of the present invention.

A path of laser light is now described with reference to FIGS. 4 and 5. FIGS. 4 and 5 are diagrams showing the vertical scanning oscillating mirror element 6 and the horizontal scanning oscillating mirror element 7, as viewed from the A1 direction side and the C2 direction side, respectively.

In the projector 100, the optical axis of the laser light reflected by the mirror 5 and the swing axis α of the horizontal scanning mirror portion 71 are substantially parallel to each other, as viewed from the A1 direction side. Therefore, the vertical scanning mirror portion 61 of the vertical scanning oscillating mirror element 6 is arranged closer to the opening 72a (C1 direction side) through which the laser light passes with respect to the horizontal scanning mirror portion 71 in order to reflect the laser light to the horizontal scanning mirror portion 71. Specifically, the vertical scanning mirror portion 61 (the optical axis of the laser light reflected by the mirror 5) is arranged closer to the opening 72a (C1 direction side) through which the laser light passes by a distance E in the direction C1 with respect to the swing axis α. More specifically, the center of the vertical scanning mirror portion 61 is located at the intersection of the vertical scanning mirror portion 61 with the optical axis of the mirror 5 parallel to the swing axis α. At this position, the vertical scanning mirror portion 61 is inclined with respect to the optical axis (3) of the laser light to be irradiated in order to reflect the laser light to be irradiated to the horizontal scanning mirror portion 71.

(Effects of First Embodiment)

According to the first embodiment, the following effects can be obtained.

According to the first embodiment, as hereinabove described, the projector 100 includes the vertical scanning mirror portion 61 that is swingable and reflects the laser light from the laser diodes 1a to 1c and the horizontal scanning mirror portion 71 that is swingable and reflects the laser light from the vertical scanning mirror portion 61, and the laser light from the laser diodes 1a to 1c passes through the opening 72a provided near the horizontal scanning mirror portion 71 and is irradiated to the vertical scanning mirror portion 61. Thus, as compared with the case where the laser light is irradiated from a position away beyond the opening 72a from the horizontal scanning mirror portion 71 to the reflection surface 61a, the laser light can pass close to the horizontal scanning mirror portion 71, and hence the optical axis of the laser light toward the vertical scanning mirror portion 61 and the optical axis of the laser light from the vertical scanning mirror portion 61 toward the horizontal scanning mirror portion 71 can be brought close to each other. More specifically, the spot diameter in the vertical scanning mirror portion 61 can be shaped to approximate a true circle. Consequently, the quality of the projection image P can be improved.

According to the first embodiment, as hereinabove described, the projector 100 includes the base 72 that is provided with the opening 72a and supports the horizontal scanning mirror portion 71 such that the horizontal scanning mirror portion 71 is swingable. Thus, the optical axis of the laser light that passes through the opening 72a of the base 72 to the vertical scanning mirror portion 61 and the optical axis of the laser light from the vertical scanning mirror portion 61 toward the horizontal scanning mirror portion 71 can be brought close to each other as compared with the case where the laser light is irradiated from the outside of the base 72 to the reflection surface 61a not through the opening 72a. More specifically, the spot diameter in the vertical scanning mirror portion 61 can be shaped to approximate a true circle. Consequently, the quality of the projection image P can be further improved.

According to the first embodiment, as hereinabove described, the vertical scanning mirror portion 61 is configured to scan the laser light in one of the horizontal direction and the vertical direction of the projection image P by swinging. Thus, the quality of the projection image P can be improved while the vertical scanning mirror portion 61 scans the laser light in one of the horizontal direction and the vertical direction of the projection image P.

According to the first embodiment, as hereinabove described, the horizontal scanning mirror portion 71 is configured to scan the laser light in the other of the horizontal direction and the vertical direction of the projection image P by swinging. Thus, the quality of the projection image P can be improved while the vertical scanning mirror portion 61 and the horizontal scanning mirror portion 71 scan the laser light in the horizontal direction and the vertical direction of the projection image P.

According to the first embodiment, as hereinabove described, the vertical scanning mirror portion 61 and the horizontal scanning mirror portion 71 are arranged such that the reflection surfaces 61a and 71a for the laser light face each other. Thus, the vertical scanning mirror portion 61 and the horizontal scanning mirror portion 71 that reflects the laser light from the vertical scanning mirror portion 61 face each other, whereby the spot diameter in the vertical scanning mirror portion 61 can be shaped to approximate a true circle.

According to the first embodiment, as hereinabove described, the laser light from the laser diodes 1a to 1c passes through the opening 72a from the back surface 72b side opposite to the refection surface 71a for the laser light of the horizontal scanning mirror portion 71 to be irradiated to the vertical scanning mirror portion 61. Thus, the laser light passes through the opening 72a from the back surface 72b side of the horizontal scanning mirror portion 71, and hence the reflection surface 61a of the vertical scanning mirror portion 61 and the reflection surface 71a of the horizontal scanning mirror portion 71 can easily face each other.

According to the first embodiment, as hereinabove described, the laser light reflected by the vertical scanning mirror portion 61 is directly irradiated to the horizontal scanning mirror portion 71. Thus, unlike the case where the laser light is indirectly irradiated to the horizontal scanning mirror portion 71 through another reflection structure other than the vertical scanning mirror portion 61, another reflection structure is not required, and hence the structure of the projector 100 can be simplified.

According to the first embodiment, as hereinabove described, the projector 100 includes the mounting substrate 74 on which the base 72 is mounted, and the mounting substrate 74 is provided with the through-hole 74b through which the laser light from the laser diodes 1a to 1c passes and is guided to the opening 72a. Thus, various wires for swinging of the horizontal scanning mirror portion 71 can be provided on the mounting substrate 74, and the laser light can be guided to the opening 72a of the base 72 through the through-hole 74b of the mounting substrate 74 while the base 72 is held by the mounting substrate 74.

According to the first embodiment, as hereinabove described, the through-hole 74b of the mounting substrate 74 overlaps with the opening 72a of the base 72 and has the opening area larger than the opening area of the opening 72a. Thus, the laser light can be easily guided to the opening 72a of the base 72 through the through-hole 74b of the mounting substrate 74.

According to the first embodiment, as hereinabove described, the base 72 includes the pair of beam portions 72f that supports the horizontal scanning mirror portion 71 such that the horizontal scanning mirror portion 71 is swingable, and is provided with the opening 72a being adjacent to at least one of the horizontal scanning mirror portion 71 and the pair of beam portions 72f. Thus, in order to allow the horizontal scanning mirror portion 71 and the pair of beam portions 72f to swing, the base 72 is provided with a hollow space in the vicinity of the horizontal scanning mirror portion 71 and the pair of beam portions 72f, and hence the existing hollow space in the vicinity of the horizontal scanning mirror portion 71 and the pair of beam portions 72f can be used as the opening 72a. Consequently, no opening 72a for passage of the laser light may be separately provided in the base 72, and hence the structure of the projector 100 can be simplified.

According to the first embodiment, as hereinabove described, the opening 72a has the elongated shape that extends in a direction in which the pair of beam portions 72f extends. Thus, even when the laser light is inclined in the direction in which the pair of beam portions 72f extends, the laser light can pass through the opening 72a without interfering with the base 72.

According to the first embodiment, as hereinabove described, the opening 72a includes a first opening (the opening 72a at the C1 direction side) provided at the first side with respect to the pair of beam portions 72f and the horizontal scanning mirror portion 71, through which the laser light passes, and a second opening (the opening 72a at the C2 direction side) provided at the second side with respect to the pair of beam portions 72f and the horizontal scanning mirror portion 71, and the pair of beam portions 72f and the horizontal scanning mirror portion 71 are sandwiched between the first opening and the second opening. Thus, the first opening and the second opening between which the pair of beam portions 72f and the horizontal scanning mirror portion 71 are sandwiched are provided, whereby the pair of beam portions 72f and the horizontal scanning mirror portion 71 can be easily swung. Furthermore, the laser light can pass close to the pair of beam portions 72f and the horizontal scanning mirror portion 71 through the first opening.

According to the first embodiment, as hereinabove described, the vertical scanning mirror portion 61 is arranged closer to the first opening (the opening 72a at the C1 direction side) with respect to the horizontal scanning mirror portion 71. Thus, even when the laser light from the laser diodes 1a to 1c is parallel to the swing axis α of the horizontal scanning mirror portion 71, the laser light can be irradiated to the vertical scanning mirror portion 61, and the laser light can be reflected to the horizontal scanning mirror portion 71. Consequently, the degree of freedom of the layout of the vertical scanning mirror portion 61 and the horizontal scanning mirror portion 71 can be improved.

According to the first embodiment, as hereinabove described, the vertical scanning mirror portion 61 is arranged closer to one of the pair of beam portions 72f at the third side (B1 direction side) with respect to the horizontal scanning mirror portion 71, and the laser light to be irradiated to the vertical scanning mirror portion 61 passes through the portion of the opening 72a in the vicinity of the other of the pair of beam portions 72f at the fourth side (B2 direction side) with respect to the horizontal scanning mirror portion 71. Thus, the laser light is inclined with respect to the horizontal scanning mirror portion 71 to pass through the opening 72a, whereby the spot diameter in the vertical scanning mirror portion 61 can be shaped to approximate a true circle, and the vertical scanning mirror portion 61 and the horizontal scanning mirror portion 71 can be brought close to each other to be arranged in a V-shape.

According to the first embodiment, as hereinabove described, the projector 100 includes the mirror 5 that bends the optical axis of the laser light from the laser diodes 1a to 1c in the direction toward the vertical scanning mirror portion 61, and the opening 72a is arranged on the path of the laser light from the mirror 5 toward the vertical scanning mirror portion 61. Thus, the laser light can be reliably guided to the opening 72a by the mirror 5.

According to the first embodiment, as hereinabove described, the base 72 is provided with the drive portion 73 that swings the horizontal scanning mirror portion 71. Thus, the horizontal scanning mirror portion 71 can be easily swung by the drive portion 73 provided on the base 72.

[Second Embodiment]

A second embodiment is now described with reference to FIGS. 1 and 6. In this second embodiment, the swing axis α of a horizontal scanning oscillating mirror element 207 and the optical axis of laser light from a mirror 5 overlap with each other in a plan view, unlike the aforementioned first embodiment in which the swing axis α of the horizontal scanning oscillating mirror element 7 and the optical axis of the laser light from the mirror 5 are deviated from each other in a plan view. Portions of a projector 200 similar to those of the projector 100 according to the aforementioned first embodiment are denoted by the same reference numerals, to omit the description.

(Structure of Projector)

Figure 6:
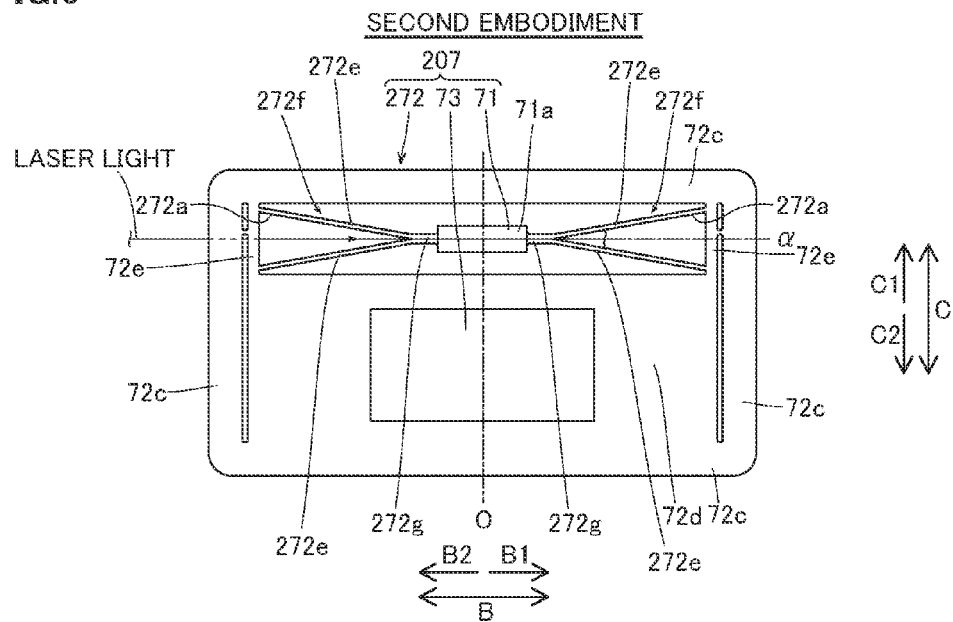
FIG. 6 is a plan view showing a horizontal scanning oscillating mirror element of a projector according to a second embodiment of the present invention.

In the projector 200 (see FIG. 1) according to the second embodiment, a base 272 is provided with openings 272a on a line that is an extension of the swing axis α of a horizontal scanning mirror portion 71 in a plan view, as shown in FIG. 6.

Specifically, the base 272 of the horizontal scanning oscillating mirror element 207 includes a pair of beam portions 272f provided at both sides in a direction B, respectively. This pair of beam portions 272f is Y-shaped. Specifically, the pair of beam portions 272f extends outward along the swing axis α from the horizontal scanning mirror portion 71, and is branched into two parts between the horizontal scanning mirror portion 71 and beam support portions 72e. The two branched parts of the pair of beam portions 272f obliquely extend to be outwardly spaced apart each other, and outward ends thereof are connected to the beam support portions 72e. In other words, the pair of beam portions 272f includes connection portions 272g and branch portions 272e. First ends of the connection portions 272g are connected to the horizontal scanning mirror portion 71. The branch portions 272e are branched from second ends of the connection portions 272g. Each of the openings 272a is sandwiched between a pair of branch portions 272e.

Therefore, the base 272 is provided with the triangular openings 272a defined by the pair of branched beam portions 272f and the beam support portions 72e on the line that is the extension of the swing axis α of the horizontal scanning mirror portion 71 in a plan view. The openings 272a are adjacent to (surrounded by) the pair of beam portions 272f and the beam support portions 72e. The respective openings 272a are provided at the B1 direction side and the B2 direction side with respect to the horizontal scanning mirror portion 71.

In the projector 200, the laser light reflected by the mirror 5 passes through an opening 272a at the B2 direction side along the swing axis α from the B2 direction side with respect to the horizontal scanning mirror portion 71, and is irradiated to the horizontal scanning oscillating mirror element 207.

The remaining structures of the second embodiment are similar to those of the aforementioned first embodiment.

(Effects of Second Embodiment)

According to the second embodiment, the following effects can be obtained.

According to the second embodiment, as hereinabove described, the base 272 is provided with the openings 272a on the line that is the extension of the swing axis α of the horizontal scanning mirror portion 71. Thus, the optical axis of the laser light can be arranged on the swing axis α of the horizontal scanning mirror portion 71 in a plan view, and hence the spot diameter of the laser light to be irradiated to a vertical scanning mirror portion 61 and the horizontal scanning mirror portion 71 can be shaped to further approximate a true circle as compared with the case where the optical axis of the laser light is deviated from the swing axis α in a plan view. Consequently, the quality of a projection image P can be further improved.

According to the second embodiment, as hereinabove described, the base 272 includes the pair of beam portions 272f that supports the horizontal scanning mirror portion 71 such that the horizontal scanning mirror portion 71 is swingable, and the beam support portions 72e that support the pair of beam portions 272f, and the pair of beam portions 272f includes the connection portions 272g having the first ends connected to the horizontal scanning mirror portion 71, and pairs of branch portions 272e branched from the second ends of the connection portions 272g and connected to the beam support portions 72e, between which the openings 272a are sandwiched. Thus, the openings 272a can be easily formed on the line that is the extension of the swing axis α of the horizontal scanning mirror portion 71 by the connection portions 272g and the pairs of branch portions 272e.

[Third Embodiment]

Figure 7:
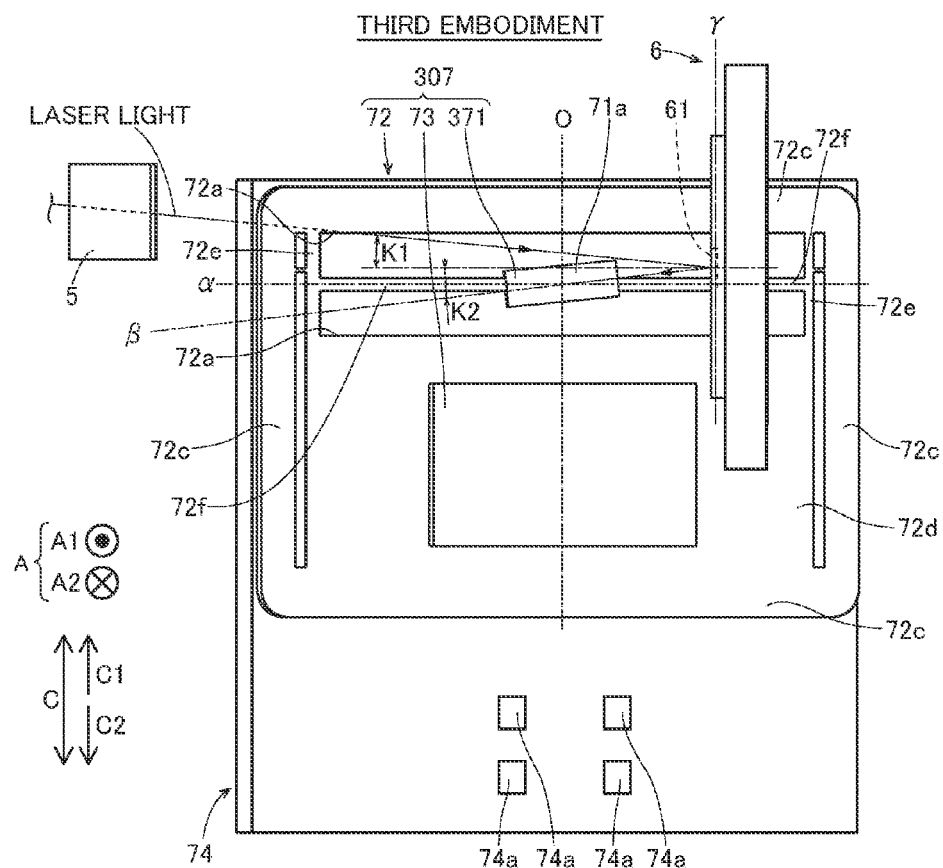
FIG. 7 is a plan view showing a horizontal scanning oscillating mirror element of a projector according to a third embodiment of the present invention.

A third embodiment is now described with reference to FIGS. 1 and 7. In this third embodiment, the longitudinal direction of a rectangular horizontal scanning mirror portion 371 and a direction in which the swing axis α of the horizontal scanning mirror portion 371 extends are different from each other, unlike the aforementioned first embodiment in which the longitudinal direction of the rectangular horizontal scanning mirror portion 71 and the direction in which the swing axis α of the horizontal scanning mirror portion 71 extends are the same as each other. Portions of a projector 300 similar to those of the projector 100 according to the aforementioned first embodiment are denoted by the same reference numerals, to omit the description. The horizontal scanning mirror portion 371 is an example of the "second reflection portion" in the claims. FIG. 7 is a diagram showing a vertical scanning oscillating mirror element 6 and a horizontal scanning oscillating mirror element 307, as viewed from the A1 direction side (one side in the short-side direction of the vertical scanning oscillating mirror element 6).

(Structure of Projector)

In the projector 300 (see FIG. 1) according to the third embodiment, the longitudinal direction (a direction in which the swing axis γ extends (see FIG. 2)) of the vertical scanning oscillating mirror element 6 is the same as the short-side direction (direction C) of the horizontal scanning oscillating mirror element 307, as shown in FIG. 7. More specifically, the swing axis γ of the vertical scanning oscillating mirror element 6 and the swing axis α of the horizontal scanning oscillating mirror element 307 are orthogonal to each other (not three-dimensionally orthogonal to each other) in FIG. 7. The horizontal scanning mirror portion 371 is arranged at the C1 direction side with respect to the swing axis α. In the projector 300, the horizontal scanning oscillating mirror element 307 is arranged such that an angle defined by the optical axis of laser light reflected by a mirror 5 and the swing axis α of the horizontal scanning oscillating mirror element 307 is an angle K1 in a plan view.

The horizontal scanning oscillating mirror element 307 includes the horizontal scanning mirror portion 371. A central axis that extends in the longitudinal direction of this horizontal scanning oscillating mirror element 307 is set to β. The short side of the horizontal scanning mirror portion 371 intersects with the swing axis α of the horizontal scanning mirror portion 371. The longitudinal direction (a direction in which the central axis β extends) of the horizontal scanning mirror portion 371 is inclined at substantially the same angle K2 as the angle K1 along the optical axis of the laser light with respect to the swing axis α of the horizontal scanning mirror portion 371 in a plan view. In other words, the angle K1 and the angle K2 are an incidence angle and a reflection angle with respect to the horizontal scanning mirror portion 371, respectively, and hence the angle K1 and the angle K2 are substantially the same as each other. Therefore, in the horizontal scanning mirror portion 371, an oblique trace is generated by irradiation of the laser light along the central axis β inclined with respect to the swing axis α. The horizontal scanning mirror portion 371 is inclined along the laser light irradiated in this oblique direction.

The remaining structures of the third embodiment are similar to those of the aforementioned first embodiment.

(Effects of Third Embodiment)

According to the third embodiment, the following effects can be obtained.

According to the third embodiment, as hereinabove described, the horizontal scanning mirror portion 371 has a rectangular shape having a short side that intersects with the swing axis α of the horizontal scanning mirror portion 371 in a plan view, and the longitudinal direction of the horizontal scanning mirror portion 371 is inclined with respect to the swing axis α of the horizontal scanning mirror portion 371. Thus, when the laser light is scanned while the optical axis thereof is inclined with respect to the swing axis α of the horizontal scanning mirror portion 371, the longitudinal direction of the horizontal scanning mirror portion 371 can be along the optical axis of the laser light reflected by a vertical scanning mirror portion 61, and hence the horizontal scanning mirror portion 371 can be reduced in size as compared with the case where the longitudinal direction of the horizontal scanning mirror portion 371 is the same as the direction in which the swing axis α extends.

(Modification)

The embodiments disclosed this time must be considered as illustrative in all points and not restrictive. The range of the present invention is shown not by the above description of the embodiments but by the scope of claims for patent, and all modifications within the meaning and range equivalent to the scope of claims for patent are further included.

For example, while the second reflection portion according to the present invention is used as the horizontal scanning mirror portion, and the first reflection portion according to the present invention is used as the vertical scanning mirror portion in each of the aforementioned first to third embodiments, the present invention is not restricted to this. The second reflection portion according to the present invention may alternatively be used as the vertical scanning mirror portion, and the first reflection portion according to the present invention may alternatively be used as the horizontal scanning mirror portion, for example.

Figure 10:
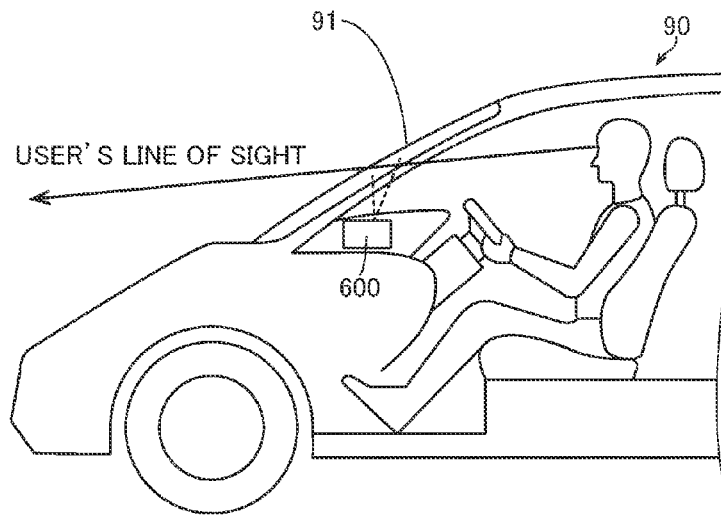
FIG. 10 illustrates the usage state of a head-up display device according to a modification of the first to third embodiments of the present invention.

While the present invention is applied to the projector in each of the aforementioned first to third embodiments, the present invention is not restricted to this. As in a modification of the first to third embodiments shown in FIG. 10, for example, the present invention may alternatively be applied to a head-up display device 600. The head-up display device 600 is mounted on a motor vehicle 90. The head-up display device 600 is configured to irradiate laser light to a windshield 91. Thus, the head-up display device 600 is configured to form a virtual image in a direction along the line of sight of a user who visually recognizes the windshield 91.

While the opening through which the laser light passes is provided adjacent to the second reflection portion or the beam portion according to the present invention in each of the aforementioned first to third embodiments, the present invention is not restricted to this. According to the present invention, the opening may not be provided adjacent to the second reflection portion and the beam portion according to the present invention, for example.

While the horizontal scanning mirror portion and the vertical scanning mirror portion have a rectangular shape and a circular shape, respectively, in each of the aforementioned first to third embodiments, the present invention is not restricted to this. According to the present invention, the horizontal scanning mirror portion and the vertical scanning mirror portion may alternatively have shapes other than the rectangular shape and the circular shape, such as an elliptical shape.

While the laser light passes through the opening at the C1 direction side (farther away from the drive portion) of the pair of openings in each of the aforementioned first and third embodiments, the present invention is not restricted to this. According to the present invention, the laser light may alternatively pass through the opening at the C2 direction side (closer to the drive portion) of the pair of openings, for example.

While the laser light reflected by the vertical scanning oscillating mirror element is directly irradiated to the horizontal scanning oscillating mirror element in each of the aforementioned first and third embodiments, the present invention is not restricted to this. According to the present invention, the laser light reflected by the vertical scanning oscillating mirror element may alternatively be indirectly irradiated to the horizontal scanning oscillating mirror element through another reflection member, for example.

While the horizontal scanning oscillating mirror element is piezoelectrically driven in each of the aforementioned first and third embodiments, the present invention is not restricted to this. According to the present invention, the horizontal scanning oscillating mirror element may alternatively be driven other than piezoelectrically driven, such as electrostatically driven.

Figure 8:
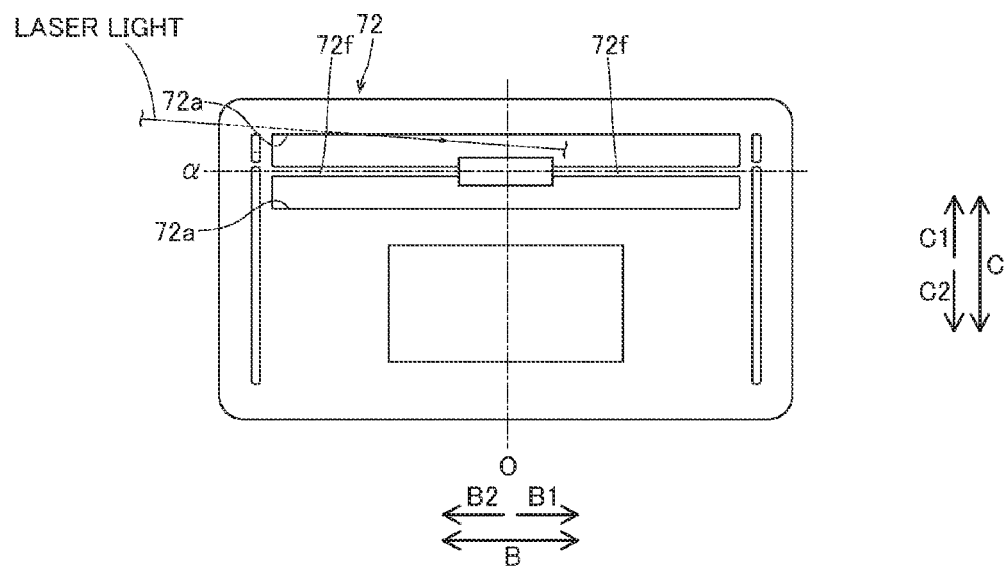
FIG. 8 is a plan view showing a horizontal scanning oscillating mirror element of a projector according to a modification of the first embodiment of the present invention.

While the optical axis of the laser light is parallel to the pair of beam portions 72f in a plan view in the aforementioned first embodiment, the present invention is not restricted to this. As in a modification of the first embodiment shown in FIG. 8, for example, the optical axis of the laser light may alternatively be inclined with respect to the pair of beam portions 72f in a plan view. In this case, the position of the vertical scanning mirror portion 61 (see FIG. 2) may not be shifted to a side closer to the opening 72a through which the laser light passes with respect to the horizontal scanning mirror portion 71.

Figure 9:
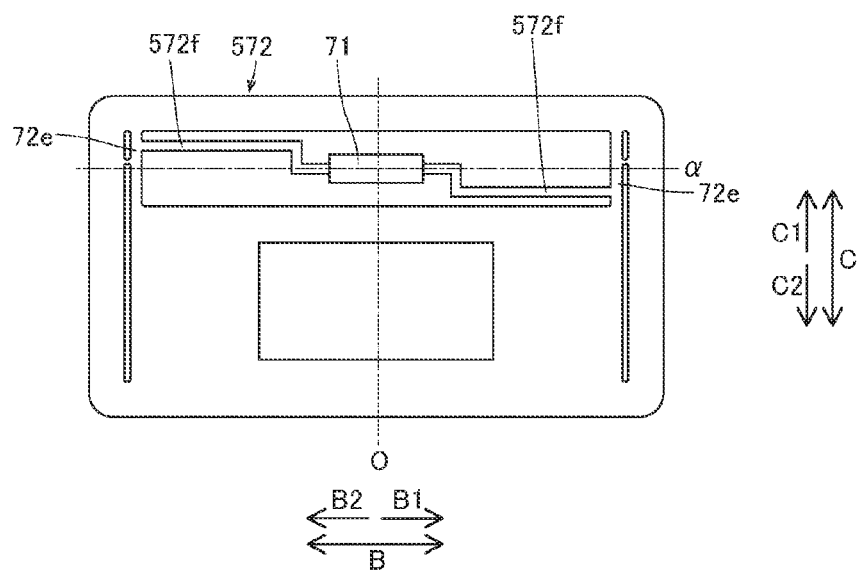
FIG. 9 is a plan view showing a horizontal scanning oscillating mirror element of a projector according to a modification of the second embodiment of the present invention.

While the pair of beam portions is Y-shaped in the aforementioned second embodiment, the present invention is not restricted to this. As in a modification of the second embodiment shown in FIG. 9, for example, a pair of beam portions 572f may alternatively be stepped. Specifically, the pair of beam portions 572f at the B1 direction side and the B2 direction side extends outward (in a direction B1 and a direction B2, respectively) from the horizontal scanning mirror portion 71. Furthermore, the pair of beam portions 572f is bent in a direction C2 and a direction C1 between the horizontal scanning mirror portion 71 and the beam support portions 72e, extends outward (in the direction B1 and the direction B2, respectively) again, and then is connected to the beam support portions 72e.

Figure 11:
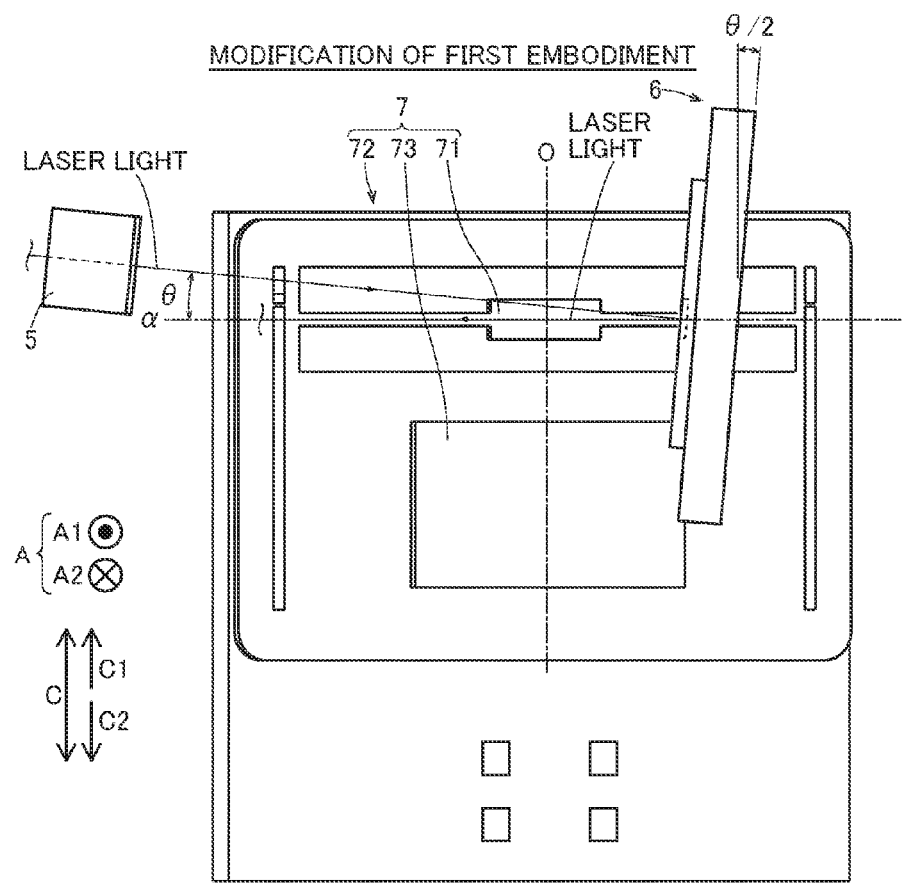
FIG. 11 illustrates a projection light path of the horizontal scanning oscillating mirror element and a vertical scanning oscillating mirror element of the projector according to the modification of the first embodiment of the present invention.

While the laser light and the swing axis α are parallel to each other as viewed from the A1 direction side, as shown in FIG. 4, in the aforementioned first embodiment, the present invention is not restricted to this. As in a modification of the first embodiment shown in FIG. 11, for example, the laser light from the mirror 5 may alternatively be inclined at an angle θ in a clockwise direction with respect to the swing axis α in FIG. 11, as viewed from the A1 direction side. In this case, the vertical scanning oscillating mirror element 6 is inclined at an angle θ/2 (about θ/2) in the clockwise direction with respect to a direction C in FIG. 11.

What is claimed is:

1. A projector comprising:
   a light source portion that emits laser light;
   a first reflection portion that is swingable and reflects the laser light from the light source portion;
   a second reflection portion that is swingable and reflects the laser light from the first reflection portion; and
   a base including the second reflection portion and an opening arranged near the second reflection portion; wherein
   the second reflection portion, the opening of the base, and the first reflection portion are arranged so that the laser light passes through the opening from a back surface side opposite to a reflection surface of the second reflection portion of the base and the laser light passing through the opening is irradiated to the first reflection portion, and the laser light reflected by the first reflection portion is reflected by the second reflection portion.

2. The projector according to claim 1, wherein
   the first reflection portion scans the laser light in one of a horizontal direction and a vertical direction of a projection image by swinging.

3. The projector according to claim 2, wherein
   the second reflection portion scans the laser light in the other of the horizontal direction and the vertical direction of the projection image by swinging.

4. The projector according to claim 1, wherein
   the first reflection portion and the second reflection portion are arranged such that a reflection surface of the first reflection portion faces the reflection surface of the second reflection portion.

5. The projector according to claim 1, wherein
   the laser light reflected by the first reflection portion is directly irradiated to the second reflection portion.

6. The projector according to claim 1, further comprising a substrate on which the base is mounted, wherein
   the substrate is provided with a through-hole through which the laser light from the light source portion passes and is guided to the opening.

7. The projector according to claim 6, wherein
   the through-hole of the substrate overlaps with the opening of the base and has an opening area larger than an opening area of the opening.

8. The projector according to claim 1, wherein
   the base includes a pair of beam portions that supports the second reflection portion such that the second reflection portion is swingable, and is provided with the opening being adjacent to at least one of the second reflection portion and the pair of beam portions.

9. The projector according to claim 8, wherein
   the opening has an elongated shape that extends in a direction in which the pair of beam portions extends.

10. The projector according to claim 8, wherein
    the opening includes a first opening provided at a first side with respect to the pair of beam portions and the second reflection portion, through which the laser light passes, and a second opening provided at a second side with respect to the pair of beam portions and the second reflection portion, and
    the pair of beam portions and the second reflection portion are sandwiched between the first opening and the second opening.

11. The projector according to claim 10, wherein
    the first reflection portion is arranged closer to the first opening with respect to the second reflection portion.

12. The projector according to claim 8, wherein
    the first reflection portion is arranged closer to one of the pair of beam portions at a third side with respect to the second reflection portion, and
    the laser light to be irradiated to the first reflection portion passes through a portion of the opening in the vicinity of the other of the pair of beam portions at a fourth side with respect to the second reflection portion.

13. The projector according to claim 1, wherein
the base is provided with the opening on a line that is an extension of a swing axis of the second reflection portion.

14. The projector according to claim 13, wherein
the base includes a pair of beam portions that supports the second reflection portion such that the second reflection portion is swingable, and a beam support portion that supports the pair of beam portions, and
the pair of beam portions includes a connection portion having a first end connected to the second reflection portion, and a pair of branch portions branched from a second end of the connection portion and connected to the beam support portion, between which the opening is sandwiched.

15. The projector according to claim 1, wherein
the second reflection portion has a rectangular shape having a short side that intersects with a swing axis of the second reflection portion in a plan view, and
a longitudinal direction of the second reflection portion is inclined with respect to the swing axis of the second reflection portion.

16. The projector according to claim 1, further comprising a light guide portion that bends an optical axis of the laser light from the light source portion in a direction toward the first reflection portion, wherein
the opening is arranged on a path of the laser light from the light guide portion toward the first reflection portion.

17. The projector according to claim 1, wherein
the base is provided with a drive portion that swings the second reflection portion.

18. A head-up display device comprising:
a light source portion that emits laser light to project an image corresponding to a virtual image that a user visually recognizes;
a first reflection portion that is swingable and reflects the laser light from the light source portion;
a second reflection portion that is swingable and reflects the laser light from the first reflection portion; and
a base including the second reflection portion and an opening arranged near the second reflection portion; wherein
the second reflection portion, the opening of the base, and the first reflection portion are arranged so that the laser light passes through the opening from a back surface side opposite to a reflection surface of the second reflection portion of the base and the laser light passing through the opening is irradiated to the first reflection portion, and the laser light reflected by the first reflection portion is reflected by the second reflection portion.

* * * * *